United States Patent
Mellot

(10) Patent No.: US 6,587,011 B2
(45) Date of Patent: Jul. 1, 2003

(54) LOW COST DIGITAL FM MODULATOR

(75) Inventor: Pascal Mellot, Lans en Vercors (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/886,951

(22) Filed: Jun. 21, 2001

(65) Prior Publication Data

US 2002/0011904 A1 Jan. 31, 2002

(30) Foreign Application Priority Data

Jun. 26, 2000 (FR) .............................................. 00 08185

(51) Int. Cl.[7] .................................................. H03C 3/00
(52) U.S. Cl. ........................................ 332/117; 332/123
(58) Field of Search .................................. 332/117, 123

(56) References Cited

U.S. PATENT DOCUMENTS

| | | | | |
|---|---|---|---|---|
| 4,628,286 A | * | 12/1986 | Nossen ........................ 332/100 |
| 5,331,293 A | * | 7/1994 | Shepherd et al. ........... 331/1 R |
| 5,563,535 A | * | 10/1996 | Corry et al. ................. 327/105 |
| 5,760,617 A | * | 6/1998 | Coln et al. ................... 327/101 |
| 6,255,975 B1 | * | 7/2001 | Swanson ..................... 341/143 |
| 6,326,912 B1 | * | 12/2001 | Fujimori ..................... 341/143 |
| 6,362,769 B1 | * | 3/2002 | Hovin et al. ................. 331/57 |

FOREIGN PATENT DOCUMENTS

EP  0 631 376 A2  12/1994

OTHER PUBLICATIONS

French Search Report from French Patent Application 00/08185, filed Jun. 26, 2000.

* cited by examiner

Primary Examiner—Michael Tokar
Assistant Examiner—Khai Nguyen
(74) Attorney, Agent, or Firm—Wolf, Greenfield & Sacks, P.C.; James H. Morris

(57) ABSTRACT

A modulator including a noise shaper receiving the input signal and providing a signal coded over one bit, a phase loop including an adder and a shift register. The adder receives the signal coded over one bit, the output of the shift register, and a constant. The input of the shift register receives the adder output. A sinusoidal shaper is coupled to the output of the shift register to provide a signal modulated in frequency by the input signal. The present invention also relates to a modulation chain including a modulator.

17 Claims, 3 Drawing Sheets

LOW COST DIGITAL FM MODULATOR

BACKGROUND OF THE INVENTION

1. Field of the Invention

The present invention generally relates to frequency modulation and, in particular to frequency modulation of a carrier by radio signals.

2. Discussion of the Related Art

The frequency modulation (FM) of carriers by audio signals is very common. It is involved in various fields, such as the radiofrequency transmission of sounds and video cameras that transmit by hertzian means a composite audio and video signal to a video recorder or a television receiver.

Generally, in television systems, the audio signal, coming from a microphone or any processing circuit, is first used to modulate in frequency a carrier of frequency equal to 4.5, 5.5, 6 or 6.5 MHz, according to the desired television standard (PAL, NTSC). The obtained FM signal is then added to the baseband video signal and the combined signal is used to modulate a carrier for transmission.

FIG. 1 illustrates in a simplified manner an FM audio modulation chain usable in such a system. In FIG. 1, an analog baseband audio input signal IN, typically having a frequency under 20 kHz, drives an analog-to-digital converter (ADC) 2. Converter 2 provides a digital audio signal coded over 16 bits, sampled at a frequency on the order of 50 kHz. The digital audio signal then generally passes through an automatic gain control unit (AGC) 4, which clips possible signal peaks and increases the level of very low sounds.

The output of unit 4 is connected to a first output terminal OUT 1. Output OUT 1 provides a digital audio signal coded over 16 bits, that can, for example, be used for mixing or sent for processing on the USB bus of a universal computer.

The audio signal at the output of the AGC unit is also provided to a digital frequency modulator (FM) 6, connected to a second output OUT 2. Output OUT 2 provides the desired signal, that is, frequency-modulated by the audio signal.

FIG. 2 illustrates in greater detail the FM modulation chain of FIG. 1.

In FIG. 2, a signal IN drives a circuit 10 acting as an analog-to-digital converter and ensuring the automatic gain control. Output OUT 1 of circuit 10 provides a digital audio signal, coded over 16 bits, here at the 52.6 kHz frequency. Circuit 10 is connected, via various processing units, to an actual FM modulator 30 that provides, on output OUT 2, a carrier modulated in frequency by the audio signal.

Circuit 10 includes a delta-sigma modulator ($\Delta\Sigma$) 11 that turns the analog input signal into a signal coded over one bit at a sampling frequency, here equal to 6.75 MHz. This signal drives a comb filter 12 followed by a decimator 13. The comb filter behaves as a low-pass filter and enables sub-sampling of the signal. Decimator 13 is a decimator by sixteen. Decimator 13 replaces sixteen successive samples of the signal with a single sample, of a value equal to the sum of the values of the replaced samples. Thus, at the output of decimator 13, the frequency is equal to 421 kHz (6.75 MHz divided by 16) and the signal is coded over sixteen bits.

Then, the signal passes through an automatic gain control unit (AGC) 14, having the same function as unit 4 of FIG. 1. Then, the signal passes through a finite impulse response filter (FIR) 15, followed by a decimator by four 17. At the output of decimator 17, the signal is sampled at a frequency of 421 kHz divided by four, that is, approximately 105 kHz. The signal, still over 16 bits, then passes through a second finite impulse response filter (FIR) 18 and a decimator by two 19. At the output of decimator 19, the signal is sampled at approximately 52.6 kHz. It is coded over 16 bits and supplies output OUT 1. Filters 15 and 18 behave as low-pass filters. These are filters with steep sides, which enable sub-samplings 17 and 19.

The output signal of circuit 10 crosses a pre-emphasis filter (PREEMP FILT) 22. This filter is intended for emphasizing the high frequencies of the audio signal for a joint transmission with the video signal (in receive mode, a de-emphasis filter, symmetrical to the pre-emphasis filter, is used to restore the original audio frequencies). Then, the signal passes through a gain multiplier unit 23. Unit 23 multiplies the signal by a constant G and aims at establishing an amplitude of the audio signal appropriate to the desired transmission standard. Then, the signal passes through an over-sampler 26 followed by a comb filter (COMB) 28. Over-sampler 26 multiplies the number of samples by 512. It conventionally operates by inserting zeroes, here 511, between two samples, and the assembly is smoothed by filter 28, used as a low-pass filter. At the output of filter 28, the signal, still coded over 16 bits, is sampled at a frequency of 27 MHz (512 times 52.6 kHz).

The signal then drives the actual FM modulator 30. The modulator conventionally includes a phase loop formed by an adder 32 and a shift register (REG) 33. Adder 32 has three inputs. On a first input, it receives the audio signal coded over 16 bits. On a second input, it receives a constant P0, coded over 25 bits. On a third input, it receives the output of shift register 33, also over 25 bits. The output of adder 32 is connected to the input of shift register 33. Register 33 is driven by a clock of frequency FS equal to 27 MHz. The output of register 33 is connected to a sinusoidal shaper (LUT) 34.

Unit 34 is formed of a look-up table, which retains at its input the 12 most significant bits from among the 25 output bits of register 33. The table provides, on output OUT 2, a sinusoidal signal corresponding to a carrier modulated in frequency by the input audio signal.

The operation of modulator 30 is the following.

Shift register 33 is a 25-bit register providing at its output a number ranging between 0 and ($2^{25}-1$). Assume, to begin with, that the audio signal is absent. Upon each clock signal, output REG' of register 33 is: REG'=REG+$P_0$ (modulo 25), REG being the register output at the preceding clock pulse. REG' follows an amplitude ramp between 0 and ($2^{25}-1$). The frequency of this ramp is a frequency F0 equal to $F_S \cdot P_0/2^{25}$. The choice of constant $P_0$ determines the carrier frequency of modulator 30. For example, a constant $P_0$ equal to 6,835,162 will provide a carrier of a frequency $F_0$ equal to 5.5 MHz. The generated ramp may easily be transformed into a sinusoidal signal by unit 34, the phase of the generated sinusoidal signal being proportional to the output signal of register 33.

When an audio signal is present, its 16 bits are aligned on the 16 most significant bits among the 25 bits of the adder. The audio signal is added to constant $P_0$, and a ramp having a frequency oscillating according to the audio signal around a central frequency determined by $P_0$ is obtained at the output of register 33. Since the audio signal is sampled at the 27-MHz frequency, the output value of the shift register changes upon each pulse of clock CK. If the audio signal was sampled at a lower frequency, it would remain constant during several clock signals and a signal having a frequency varying by steps would be obtained as an output, which is not desirable. Unit 34 then receives the ramp at the register output and provides on output OUT 2 a signal corresponding to a carrier of frequency $F_0$ modulated by the input audio signal.

The modulation chain of FIG. 2 has many disadvantages.

For example, modulator 30 is bulky and relatively expensive. The shift register indeed occupies a non-negligible space in the circuit, and so does the adder. The bus connecting the output of the shift register to the adder input is also bulky.

Further, to bring the audio signal to the operating frequency of the modulator, prior art provides an interpolator, which multiplies the sample frequency by 512. This interpolator by 512 is an expensive and bulky component. Also, finite impulse response filters 15 and 18 are expensive components.

SUMMARY OF THE INVENTION

An object of the present invention is to provide a digital FM modulator that is simpler, of reduced size and less expensive than in prior art.

Another object of the present invention is to simplify the signal processing upstream of the modulator, by providing a simpler, less bulky and less expensive FM modulation chain than in prior art.

To achieve these objects as well as others, the present invention provides a modulator to implement a frequency modulation by means of a digital input signal coded over a first predetermined number of bits and sampled at a first frequency.

The modulator includes:

a noise shaper receiving the input signal and providing, based thereon, a signal coded over one bit, a phase loop including an adder and a shift register, the adder receiving said signal coded over one bit, the output of the shift register, and a constant, the shift register receiving the adder output, and a sinusoidal shaper coupled to the output of the shift register to provide a signal modulated in frequency by the input signal.

According to an embodiment of the present invention, the shift register is driven by a clock having a high drive frequency and in which said first frequency is equal to the drive frequency.

According to an embodiment of the present invention, the drive frequency is equal to 27 MHz.

According to an embodiment of the present invention, the shift register is a 14-bit register.

According to an embodiment of the present invention, said input signal is an audio signal.

The present invention also provides an FM modulation chain including:

a modulator such as previously described, a pre-emphasis unit for emphasizing the high frequencies of a digital signal coded over a second predetermined number of bits sampled at a second frequency smaller than the first sampling frequency, a variable-gain unit, and an interpolator for, on the one hand, transforming the second signal frequency into the first frequency and, on the other hand, having the number of bits of the signal coded over the second predetermined number of bits pass from the second predetermined number to the first predetermined number, the pre-emphasis unit, the variable gain unit and the interpolator being connected in this order and the interpolator output being connected to the noise shaper of the modulator.

According to an embodiment of the present invention, the interpolator includes an oversampler followed by a comb filter.

According to an embodiment of the present invention, the second frequency is equal to 421 kHz and the interpolator performs an interpolation by 64.

According to an embodiment of the present invention, the modulation chain further includes:

a unit for converting the input analog audio signal into a digital signal coded over the second predetermined number of bits at the second sampling frequency, an automatic gain control unit connected to the pre-emphasis unit, and an output arranged between the automatic gain control unit and the pre-emphasis unit, for providing a digital signal coded over the second predetermined number of bits sampled at said second frequency.

According to an embodiment of the present invention, the first and second predetermined numbers are both equal to 16.

The foregoing objects, features and advantages of the present invention, will be discussed in detail in the following non-limiting description of specific embodiments in connection with the accompanying drawings.

DETAILED DESCRIPTION

Figure 1:
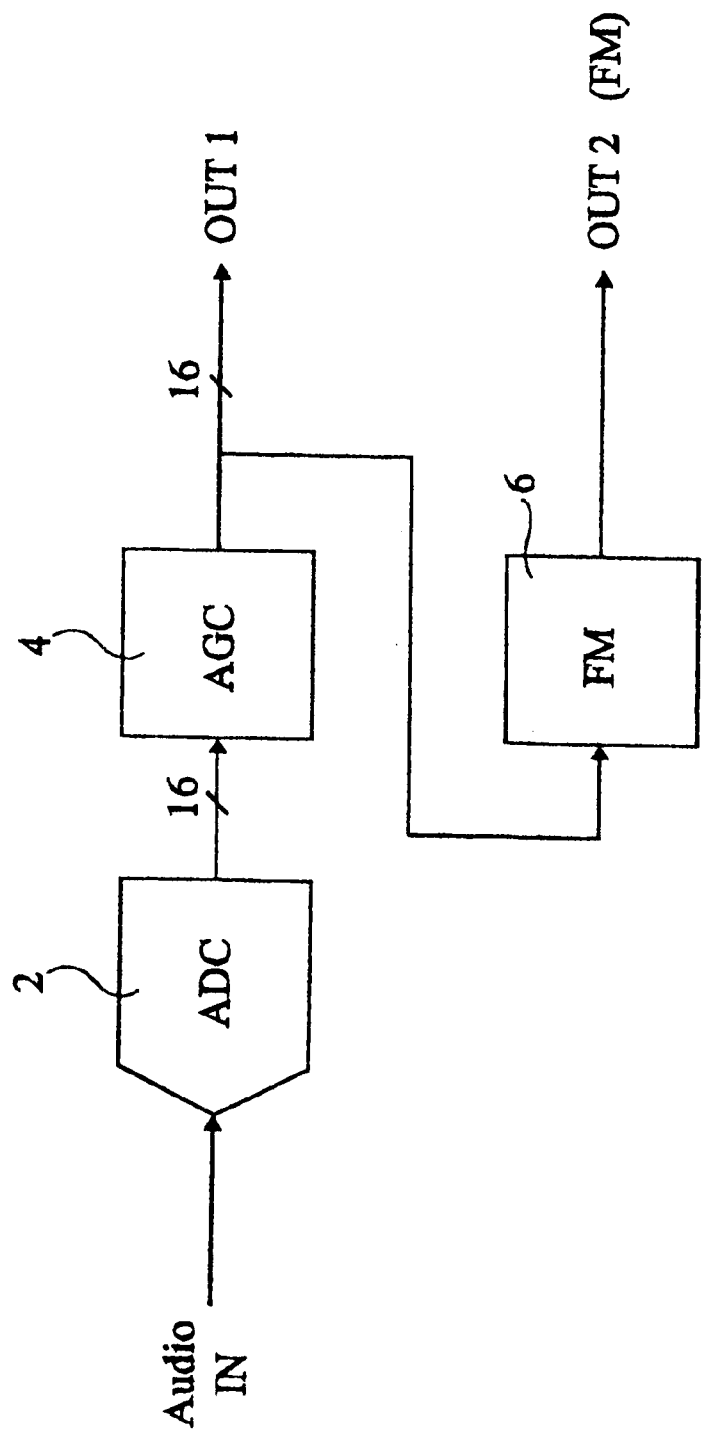
FIG. 1, previously described, illustrates a simplified diagram of an FM modulation chain for an audio signal, FIG. 2, previously described, illustrates in more detail the modulation chain of FIG. 1.
Figure 2:
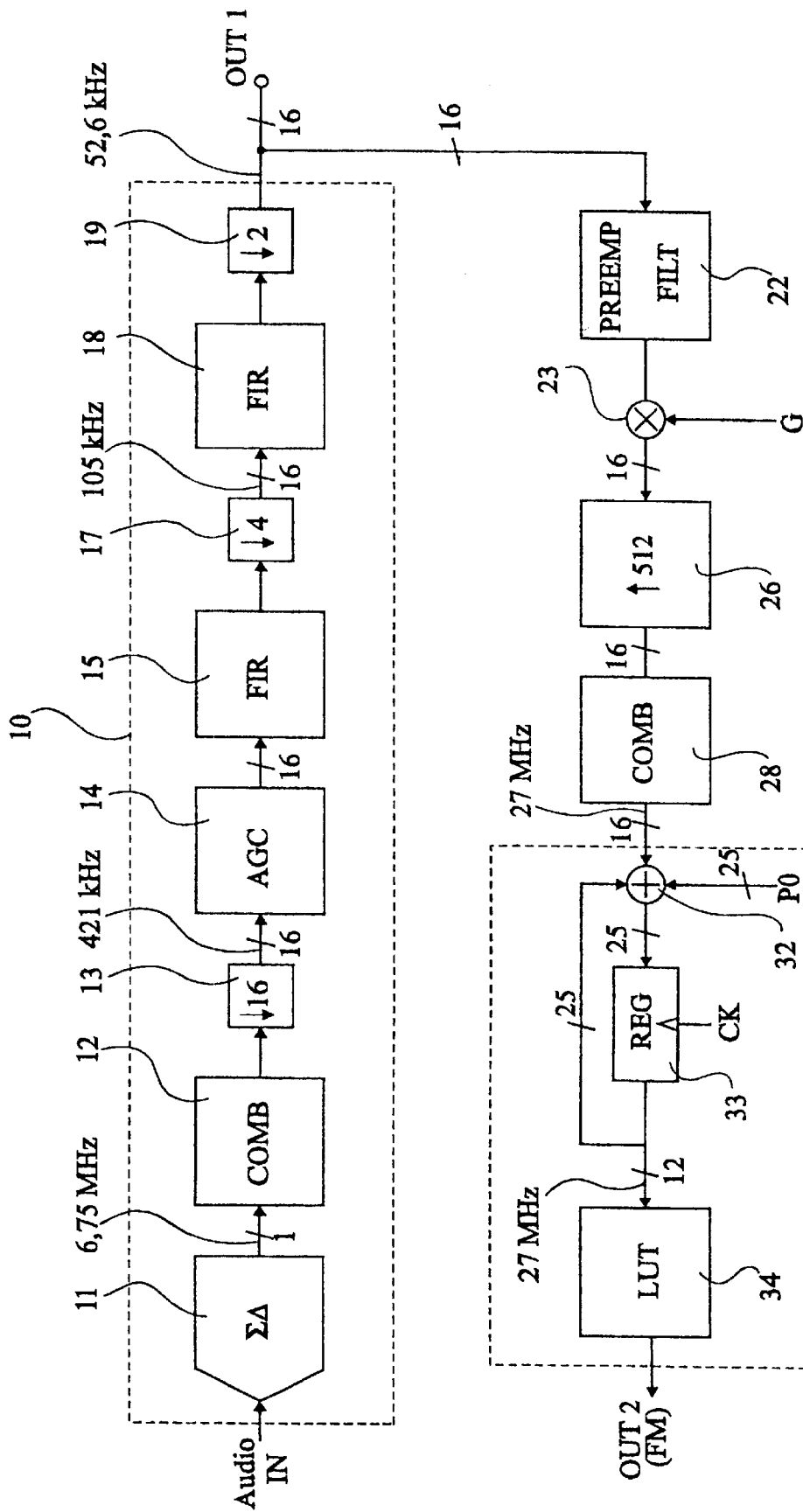
Figure 3:
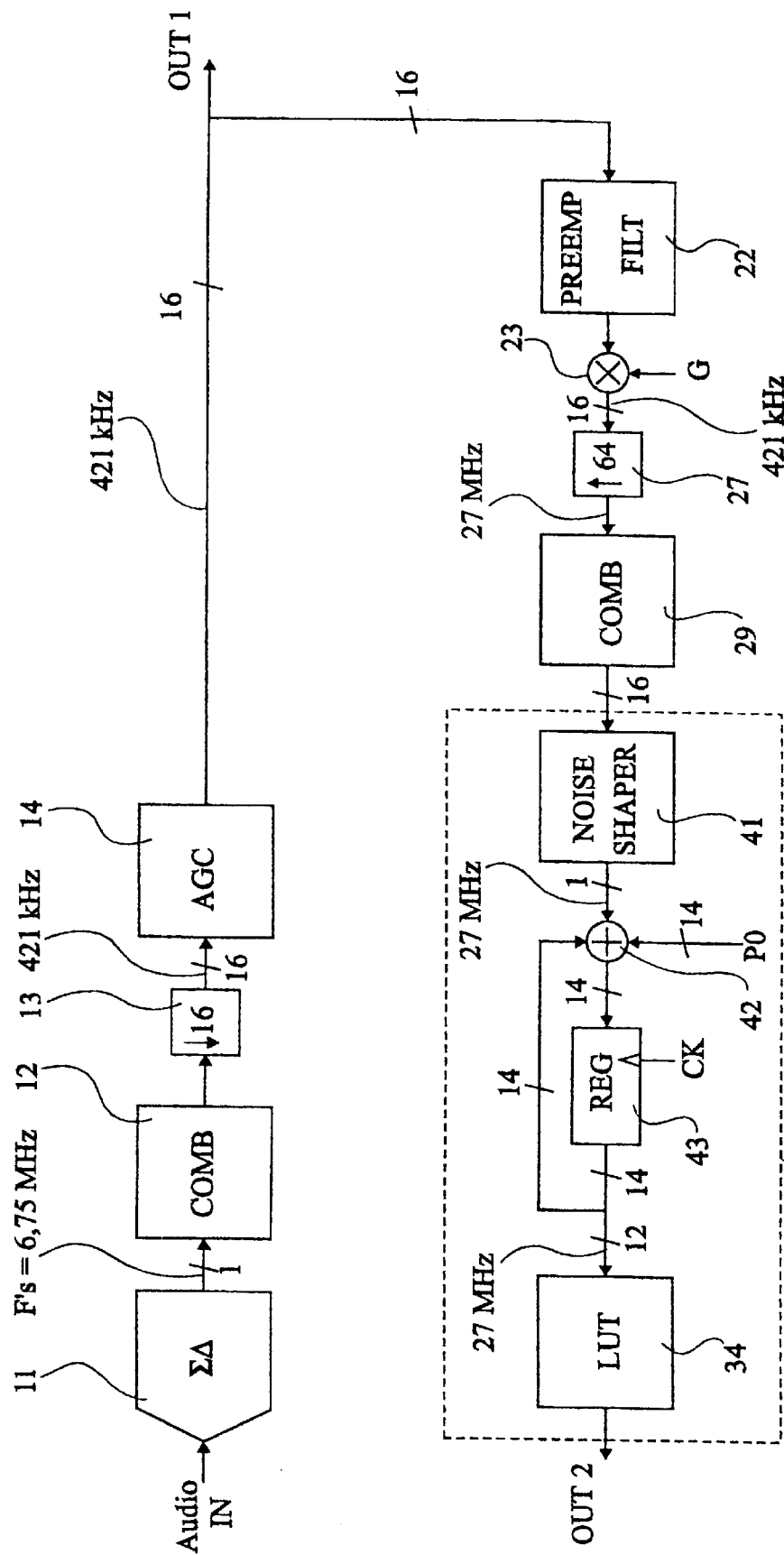
FIG. 3 illustrates an FM modulation chain according to the present invention.

In FIG. 3, elements similar to those in FIG. 2 have been referred to with the same references. An analog input audio signal, Audio IN, drives a modulator $\Delta\Sigma$ 11 followed by a comb filter 12 and by a decimator 13. As in FIG. 2, modulator $\Delta\Sigma$ provides a signal coded over one bit sampled at a frequency F'S equal to 6.75 MHz. The signal at the output of decimator 13 is a signal coded over 16 bits sampled at 421 kHz. The signal then passes through an automatic gain control unit (AGC) 14 connected to a first output OUT 1.

Output OUT 1 provides, in the present invention, a digital audio signal coded over 16 bits, sampled at the 421-kHz frequency. Indeed, an external processing of the audio signal can be performed at the 421-kHz frequency instead of approximately 50 kHz.

The fact of providing at output OUT 1 a digital signal at 421 kHz considerably simplifies the modulation chain. Thus, as compared to the conventional previously-discussed chain, filters 15 and 16, as well as decimators 17 and 19, are no longer used. The elimination of filters 15 and 16 is particularly advantageous, since, given that these filters require very steep edges, they are usually made in the form of finite impulse response filters, and are therefore expensive.

The signal at the output of unit 14 drives a pre-emphasis filter 22 followed by a gain unit 23. These components have the same function as in FIG. 2, but they operate on a signal sampled at the 421-kHz frequency, which is performed with no particular difficulty. At the output of unit 23, the signal is coded over 16 bits and has a sampling frequency of 421 kHz.

The signal then drives an oversampler 27 followed by a comb filter 29. Oversampler 27 multiplies the number of samples by 64. Filter 29 is used as a low-pass filter and smoothes the oversampler output signal. The output of filter 29 provides a digital audio signal coded over 16 bits, sampled at the 27-MHz frequency.

Components 27 and 28 form an interpolator. This interpolator is an interpolator by 64. Accordingly, it is much simpler to implement than the interpolator by 512 of FIG. 2. It is also less bulky and is less expensive.

Then, the signal enters the actual FM modulator 40. Modulator 40 includes a phase loop formed by an adder with three inputs 42 and a shift register 43. The phase loop is followed by a sinusoidal shaper 34. Components 42, 43, and 34 have the same function and are connected in the same way as in FIG. 2. However, according to the present invention, the phase loop is not directly driven by a signal coded over 16 bits. Indeed, the output signal of unit 29 drives a noise shaper 41.

Shaper 41 shapes up the audio signal and turns the signal coded over 16 bits, sampled at the 27-MHz frequency, into a signal of same frequency, coded over one bit. The output signal of shaper 41 appears as a sequence of "1s" and "0s". For example, if the input signal amplitude is close to zero, shaper 41 will provide samples successively equal to "1" and to "0", at the 27-MHz rate. If the signal amplitude is large, shaper 41 will provide a long sequence of "1s" followed by a small number "0s", or even by a single one. There is no loss of information since the useful band of the audio signal (typically under 20 kHz) is much lower than the sampling frequency (27 MHz). The quantization noise introduced by shaper 41 is, as known in noise shapers, rejected towards high frequencies, outside the useful signal band.

Noise shapers are of various types. For example, shaper 41 may be a delta-sigma modulator, including a loop formed of an integrator, of a quantizer, and of a subtractor.

The introduction of shaper 41 is very advantageous. Indeed, the audio signal arriving at the input of adder 42 is no longer coded over 16 bits but over one bit only. To have the necessary frequency, the phase loop needs not, in this case, operate with 25 bits. Tests performed by the applicant have shown that, according to standards, 12 to 14 bits are sufficient to obtain an adequate frequency modulation. In the example shown in FIG. 3, 14 bits have been chosen.

Thus, the three inputs of adder 42 respectively receive a constant P0 coded over 14 bits, the output signal of shift register 43 coded over 14 bits, and the output signal of shaper 41, the single bit of which is aligned on the most significant bit of the two preceding signals.

Shift register 43, driven at a rate FS equal to 27 MHz by a drive clock CK, as in FIG. 2, receives and provides signals coded over 14 bits. The ramp that it provides as an output has an amplitude ranging between 0 and $(2^{14}-1)$ and a frequency that oscillates around a central frequency determined by constant $P_0$.

The fact for the phase loop to operate with 14 bits only implies that components 42 and 43 are simpler, less bulky, and less expensive. Thus, the buses connecting these elements are not as wide and accordingly have the preceding advantages.

The output of register 43 is connected to a sinusoidal shaper 34. Shaper 34 samples the 12 most significant bits of the signal provided thereto. It generates, on output OUT 2, a carrier of desired frequency modulated in frequency by the audio signal.

It should be noted that the introduction of shaper 41 does not decrease the performance and quality of the obtained FM modulation. Thus, the present invention allows a smaller cost of the modulator, as well as a simplification of the modulation chain.

It should also be noted that the modulation chain of the present invention has a lower power consumption as compared to the prior art.

It should further be noted that the circuit of FIG. 3 is a multiple-standard circuit enabling easy adaptation to any desired modulation standard. Indeed, a mere modification of constants $P_0$ and G enables modification of the carrier frequency and of its maximum frequency excursion to obtain desired values.

Of course, the present invention is likely to have various alterations, modifications, and improvements which will readily occur to those skilled in the art.

Thus, the present invention has been described in the context of the FM modulation of a carrier by sounds associated with a video signal. The carrier could be modulated by sounds not associated with a video signal or by signals that are not audio signals.

Also, the values of the frequencies are given as an example and can be modified. In particular, the drive frequency of register 43 (FS) may be any value that fulfills the Nyquist criterion, that is, equal to at least twice the maximum frequency present on output OUT 2. The output frequency of unit 11 (FS') will preferably be equal to FS/4, which does not modify the sampling ratios of decimator 13 and of oversampler 64, but those skilled in the art may choose a frequency $F_S'$ different from $F_S/4$ and adapt the circuit accordingly.

It should also be noted that the number of bits presented by the signal in the modulation chain, in particular on output OUT 1, may be different from 16, and equal, for example, to 12. Generally, the signal can be coded over n bits at the output of filter 29 and over n' bits at the output of decimator 13 (n' greater or smaller than n), such modifications being within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A modulator to implement a frequency modulation by means of a digital input signal coded over a first predetermined number of bits and sampled at a first frequency, including:

a noise shaper receiving the digital input signal and providing, based thereon, a signal coded over one bit, a phase loop including an adder and a shift register, the adder receiving said signal coded over one bit, an output of the shift register, and a constant, the shift register receiving the adder output, and a sinusoidal shaper coupled to the output of the shift register to provide a signal modulated in frequency by the input signal.

2. The modulator of claim 1, wherein the shift register is driven by a clock having a high drive frequency and in which said first frequency is equal to the drive frequency.

3. The modulator of claim 2, wherein the drive frequency is equal to 27 MHz.

4. The modulator of claim 2, wherein the shift register is a 14-bit register.

5. The modulator of claim 1, wherein said input signal is an audio signal.

6. An FM modulation chain including:
   the modulator of claim 1,
   a pre-emphasis unit for emphasizing high frequencies of a digital signal coded over a second predetermined number of bits sampled at a second frequency smaller than the first sampling frequency,
   a variable-gain unit, and
   an interpolator for, on one hand, transforming the second signal frequency into the first frequency and, on the other hand, having the number of bits of the signal coded over the second predetermined number of bits pass from the second predetermined number to the first predetermined number,
   the pre-emphasis unit, the variable gain unit and the interpolator being connected in this order and the interpolator output being connected to the noise shaper of the modulator.

7. The modulation chain of claim 6, wherein the interpolator includes an oversampler followed by a comb filter.

8. The modulation chain of claim 6, wherein the second frequency is equal to 421 kHz and the interpolator performs an interpolation by 64.

9. The modulation chain of claim 6, further including:
   a unit for converting the input analog audio signal into a digital signal coded over the second predetermined number of bits at the second sampling frequency,
   an automatic gain control unit connected to the pre-emphasis unit, and
   an output arranged between the automatic gain control unit and the pre-emphasis unit, for providing a digital signal coded over the second predetermined number of bits sampled at said second frequency.

10. The modulation chain of claim 6, wherein the first and second predetermined numbers are both equal to 16.

11. A method of frequency modulating a carrier signal with a first digital signal having a first frequency and coded over a first plurality of bits, the method comprising acts of:
   noise shaping the first digital signal coded over the first plurality of bits into a second digital signal coded over one bit;
   summing together a feedback signal, a constant signal and the second digital signal to provide a summed signal;
   shifting the summed signal at a drive frequency to provide the feedback signal and a first modulated signal; and
   shaping the first modulated signal into a frequency modulated signal modulated in frequency by the first digital signal.

12. The method of claim 11, further comprising an act of emphasizing high frequencies of a third digital signal coded over a second plurality of bits and having a second frequency to provide the first digital signal.

13. The method of claim 12, wherein the act of emphasizing the high frequencies of the third digital signal includes an act of applying a variable gain to the third digital signal.

14. The method of claim 13, wherein the act of emphasizing the third digital signal includes an act of interpolating the third digital signal such that the third digital signal has the first frequency to provide the first digital signal.

15. The method of claim 14, wherein the act of interpolating the third digital signal includes an act of oversampling the third digital signal followed by filtering the third digital signal with a comb filter.

16. The method of claim 15, wherein the act of filtering the third digital signal converts the second plurality of bits to the first plurality of bits.

17. The method of claim 11, further comprising acts of:
   digitizing an analog signal into a fourth digital signal;
   modifying the fourth digital signal to be coded over the second plurality of bits; and
   applying the fourth digital signal to an automatic gain control unit to provide the third digital signal.

* * * * *